United States Patent
Farnworth et al.

(10) Patent No.: US 7,262,405 B2
(45) Date of Patent: Aug. 28, 2007

(54) PREFABRICATED HOUSINGS FOR MICROELECTRONIC IMAGERS

(75) Inventors: Warren M. Farnworth, Nampa, ID (US); Sidney B. Rigg, Meridian, ID (US); David R. Hembree, Boise, ID (US); William M. Hiatt, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 200 days.

(21) Appl. No.: 10/867,505

(22) Filed: Jun. 14, 2004

(65) Prior Publication Data

US 2005/0275051 A1 Dec. 15, 2005

(51) Int. Cl.
- H01J 5/02 (2006.01)
- H01L 27/00 (2006.01)
- H01L 31/0203 (2006.01)
- H01L 21/00 (2006.01)
- H04N 5/225 (2006.01)

(52) U.S. Cl. .................. 250/239; 250/208.1; 257/433; 348/374; 438/64; 438/106; 438/116

(58) Field of Classification Search ............ 250/208.1, 250/214.1, 239; 257/432–434, 678, 680, 257/684; 348/335, 340, 294, 374; 156/204, 156/224, 227; 438/64–66, 106, 116

See application file for complete search history.

(56) References Cited

U.S. PATENT DOCUMENTS

| | | | |
|---|---|---|---|
| 3,345,134 A | 10/1967 | Heymer et al. | |
| 4,534,100 A | 8/1985 | Lane | |
| 4,906,314 A | 3/1990 | Farnworth et al. | |
| 5,130,783 A | 7/1992 | McLellan | |
| 5,371,397 A | 12/1994 | Maegawa et al. | |
| 5,424,573 A | 6/1995 | Kato et al. | |
| 5,435,887 A | 7/1995 | Rothschild et al. | |
| 5,505,804 A | 4/1996 | Mizuguchi et al. | |
| 5,593,913 A | 1/1997 | Aoki | |

(Continued)

FOREIGN PATENT DOCUMENTS

EP    0 886 323    12/1998

(Continued)

OTHER PUBLICATIONS

U.S. Appl. No. 10/785,466, Kirby.

(Continued)

Primary Examiner—Georgia Epps
Assistant Examiner—Pascal M. Bui-Pho
(74) Attorney, Agent, or Firm—Dickstein Shapiro LLP

(57) ABSTRACT

Microelectronic imagers with prefabricated housings and methods of packaging microelectronic imagers are disclosed herein. In one embodiment, a microelectronic imager can include a microelectronic die, an image sensor, and an integrated circuit operatively coupled to the integrated circuit. The microelectronic imager also includes an optic unit having an optic member. The microelectronic imager further includes a prefabricated housing having a first mounting site and a second mounting site. The die is seated within the housing at the first mounting site and the optics unit is seated within the housing at the second mounting site in a fixed, preset position in which the optic member is situated at a desired location relative to the image sensor.

32 Claims, 6 Drawing Sheets

U.S. PATENT DOCUMENTS

| | | | |
|---|---|---|---|
| 5,605,783 A | 2/1997 | Revelli et al. | |
| 5,672,519 A | 9/1997 | Song et al. | |
| 5,694,246 A | 12/1997 | Aoyama et al. | |
| 5,708,293 A | 1/1998 | Ochi et al. | |
| 5,771,158 A | 6/1998 | Yamagishi et al. | |
| 5,776,824 A | 7/1998 | Farnworth et al. | |
| 5,811,799 A | 9/1998 | Wu | |
| 5,821,532 A | 10/1998 | Beaman et al. | |
| 5,857,963 A | 1/1999 | Pelchy et al. | |
| 5,861,654 A | 1/1999 | Johnson | |
| 5,877,040 A | 3/1999 | Park et al. | |
| 5,897,338 A | 4/1999 | Kaldenberg | |
| 5,914,488 A | 6/1999 | Sone | |
| 5,977,535 A | 11/1999 | Rostoker | |
| 5,998,862 A | 12/1999 | Yamanaka | |
| 6,080,291 A | 6/2000 | Woodruff et al. | |
| 6,104,086 A | 8/2000 | Ichikawa et al. | |
| 6,114,240 A | 9/2000 | Akram et al. | |
| 6,143,588 A | 11/2000 | Glenn | |
| 6,236,046 B1 | 5/2001 | Watabe et al. | |
| 6,259,083 B1 | 7/2001 | Kimura | |
| 6,266,197 B1 | 7/2001 | Glenn et al. | |
| 6,274,927 B1 | 8/2001 | Glenn | |
| 6,285,064 B1 | 9/2001 | Foster | |
| 6,351,027 B1 | 2/2002 | Giboney et al. | |
| 6,372,548 B2 | 4/2002 | Bessho et al. | |
| 6,407,381 B1 | 6/2002 | Glenn et al. | |
| 6,411,439 B2 | 6/2002 | Nishikawa | |
| 6,483,652 B2 | 11/2002 | Nakamura | |
| 6,503,780 B1 | 1/2003 | Glenn et al. | |
| 6,541,762 B2 | 4/2003 | Knag et al. | |
| 6,560,047 B2 | 5/2003 | Choi et al. | |
| 6,566,745 B1 | 5/2003 | Beyne et al. | |
| 6,603,183 B1 | 8/2003 | Hoffman | |
| 6,617,623 B2 | 9/2003 | Rhodes | |
| 6,661,047 B2 | 12/2003 | Rhodes | |
| 6,667,551 B2 | 12/2003 | Hanaoka et al. | |
| 6,670,986 B1 | 12/2003 | Ben Shoshan et al. | |
| 6,686,588 B1* | 2/2004 | Webster et al. | 250/239 |
| 6,703,310 B2 | 3/2004 | Mashino et al. | |
| 6,707,125 B2* | 3/2004 | Harazono | 257/434 |
| 6,864,172 B2 | 4/2004 | Noma et al. | |
| 6,734,419 B1* | 5/2004 | Glenn et al. | 250/239 |
| 6,759,266 B1 | 7/2004 | Hoffman | |
| 6,774,486 B2 | 8/2004 | Kinsman | |
| 6,778,046 B2 | 8/2004 | Stafford et al. | |
| 6,791,076 B2 | 9/2004 | Webster | |
| 6,795,120 B2 | 9/2004 | Takagi et al. | |
| 6,797,616 B2 | 9/2004 | Kinsman | |
| 6,800,943 B2 | 10/2004 | Adachi | |
| 6,813,154 B2 | 11/2004 | Diaz et al. | |
| 6,825,458 B1 | 11/2004 | Moess et al. | |
| 6,828,663 B2 | 12/2004 | Chen et al. | |
| 6,828,674 B2 | 12/2004 | Karpman | |
| 6,844,978 B2 | 1/2005 | Harden et al. | |
| 6,882,021 B2 | 4/2005 | Boon et al. | |
| 6,885,107 B2 | 4/2005 | Kinsman | |
| 6,934,065 B2 | 8/2005 | Kinsman | |
| 6,946,325 B2 | 9/2005 | Yean et al. | |
| 2002/0006687 A1* | 1/2002 | Lam | 438/118 |
| 2002/0057468 A1 | 5/2002 | Segawa et al. | |
| 2002/0089025 A1 | 7/2002 | Chou | |
| 2002/0096729 A1 | 7/2002 | Tu et al. | |
| 2002/0113296 A1 | 8/2002 | Cho et al. | |
| 2002/0145676 A1* | 10/2002 | Kuno et al. | 348/340 |
| 2003/0062601 A1 | 4/2003 | Harnden et al. | |
| 2004/0012698 A1 | 1/2004 | Suda et al. | |
| 2004/0023469 A1 | 2/2004 | Suda | |
| 2004/0038442 A1 | 2/2004 | Kinsman | |
| 2004/0041261 A1 | 3/2004 | Kinsman | |
| 2004/0082094 A1 | 4/2004 | Yamamoto | |
| 2004/0214373 A1 | 10/2004 | Jiang et al. | |
| 2004/0245649 A1 | 12/2004 | Imaoka | |
| 2005/0052751 A1 | 3/2005 | Liu et al. | |
| 2005/0104228 A1 | 5/2005 | Rigg et al. | |
| 2005/0110889 A1 | 5/2005 | Tuttle et al. | |
| 2005/0127478 A1 | 6/2005 | Hiatt et al. | |
| 2005/0151228 A1 | 7/2005 | Tanida et al. | |
| 2005/0184219 A1* | 8/2005 | Kirby | 250/208.1 |
| 2005/0236708 A1 | 10/2005 | Farnworth et al. | |
| 2005/0254133 A1 | 11/2005 | Akram et al. | |

FOREIGN PATENT DOCUMENTS

| | | | |
|---|---|---|---|
| EP | 1 157 967 A2 | 11/2001 | |
| FR | 2 835 654 A1 | 8/2003 | |
| JP | 59-101882 A | 6/1984 | |
| JP | 59-191388 | 10/1984 | |
| JP | 07-263607 A | 10/1995 | |
| JP | 2001-077496 A | 3/2001 | |
| WO | WO-90/05424 A1 | 5/1990 | |
| WO | WO-02/075815 A1 | 9/2002 | |
| WO | WO-02/095796 A2 | 11/2002 | |
| WO | WO-2004/054001 A2 | 6/2004 | |

OTHER PUBLICATIONS

U.S. Appl. No. 10/845,304, Jiang et al.
U.S. Appl. No. 10/857,948, Boettiger et al.
U.S. Appl. No. 10/863,994, Akram et al.
U.S. Appl. No. 10/864,974, Kirby et al.
U.S. Appl. No. 10/867,352, Farnworth et al.
U.S. Appl. No. 10/879,398, Akram et al.
U.S. Appl. No. 10/879,838, Kirby et al.
U.S. Appl. No. 10/893,022, Hall et al.
U.S. Appl. No. 10/894,262, Farnworth et al.
U.S. Appl. No. 10/901,851, Derderian et al.
U.S. Appl. No. 10/910,491, Bolken et al.
U.S. Appl. No. 10/915,180, Street et al.
U.S. Appl. No. 10/919,604, Farnworth et al.
U.S. Appl. No. 10/922,177, Oliver et al.
U.S. Appl. No. 10/922,192, Farnworth.
U.S. Appl. No. 10/925,406, Oliver.
U.S. Appl. No. 10/925,501, Oliver.
U.S. Appl. No. 10/925,502, Watkins et al.
U.S. Appl. No. 10/927,550, Derderian et al.
U.S. Appl. No. 10/927,760, Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692, Boemler.
U.S. Appl. No. 11/056,211, Hembree et al.
U.S. Appl. No. 11/056,484, Boettiger et al.
U.S. Appl. No. 11/061,034, Boettiger.
U.S. Appl. No. 11/146,783, Tuttle et al.
U.S. Appl. No. 11/169,546, Sulfridge.
U.S. Appl. No. 11/169,838, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,126, Farnworth et al.
U.S. Appl. No. 11/218,243, Kirby et al.
Aachboun, S. and P. Ranson, "Cryogenic etching of deep narrow trenches in silicon," J. Vac. Sci. Technol. A 18(4), Jul./Aug. 2000, pp. 1848-1852.
Aachboun, S. and P. Ranson, "Deep anisotropic etching of silicon," J. Vac. Sci. Technol. A 17(4), Jul./Aug. 1999, pp. 2270-2273.
Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.
Blackburn, J.M. et al., "Deposition of Conformal Copper and Nickel Films from Supercritical Carbon Dioxide," Science, vol. 294, pp. 141-145, Oct. 5, 2001.

Brubaker, C. et al., "Ultra-thick Lithography for Advanced Packaging and MEMS," SPIE's 27th Annual International Symposium on Microlithography 2002, Mar. 3-8, 2002, Santa Clara, CA.

Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.

DuPont Electronic Materials, Data Sheet, Pyralux PC 2000 Flexible Composites, 4 pages, Oct. 1998, <http://www.dupont.com/fcm>.

Edmund Industrial Optics, Mounted IR Filters, 1 page, retrieved from the Internet on Jun. 30, 2003, <http://www.edmundoptics.com<.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

King, B. et al., Optomec, Inc., M3D™ Technology, Maskless Mesoscale™ Materials Deposition, 5 pages, <http://www.optomec.com/downloads/M3D%20White%Paper%20080502.pdf<, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for MICRO Project 98-144, 3 pages, Department of Electrical & Computer Engineering, University of California, Davis.

Micro Chem, Nano SU-8, Negative Tone Photoresist Formulations 50-100, 4 pages, Feb. 2002, <http://www.microchem.com/products/pdf/SU8_50-100.pdf>.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Optomec. Inc., M3D™, Maskless Mesoscale™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pages, EE Times, Jul. 18, 2003.

* cited by examiner

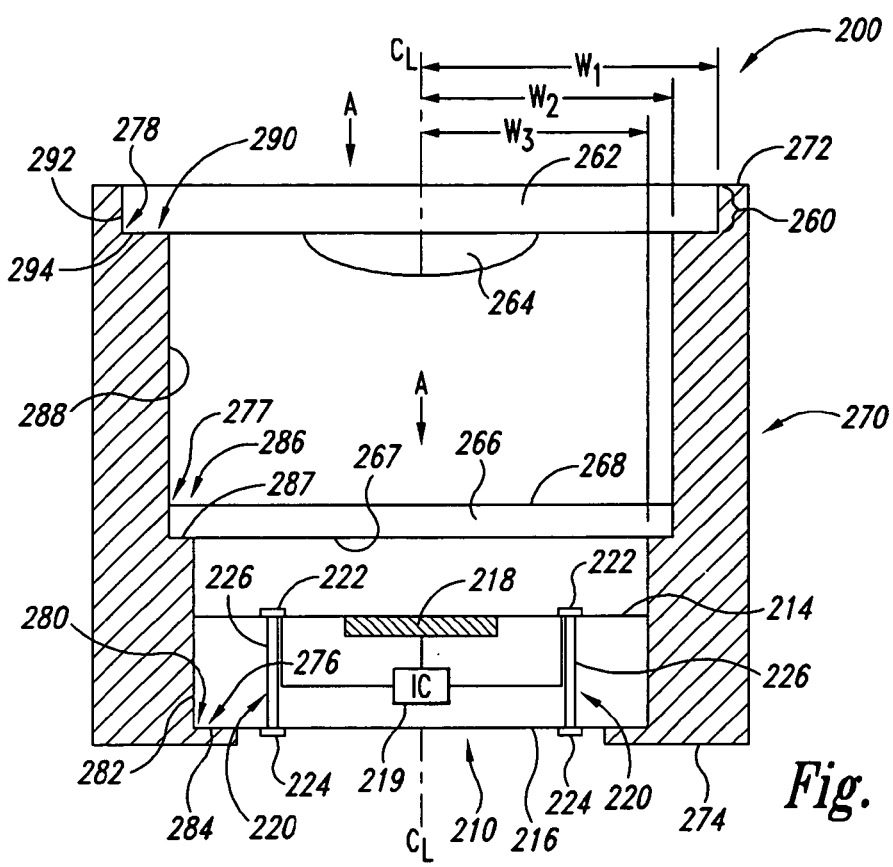
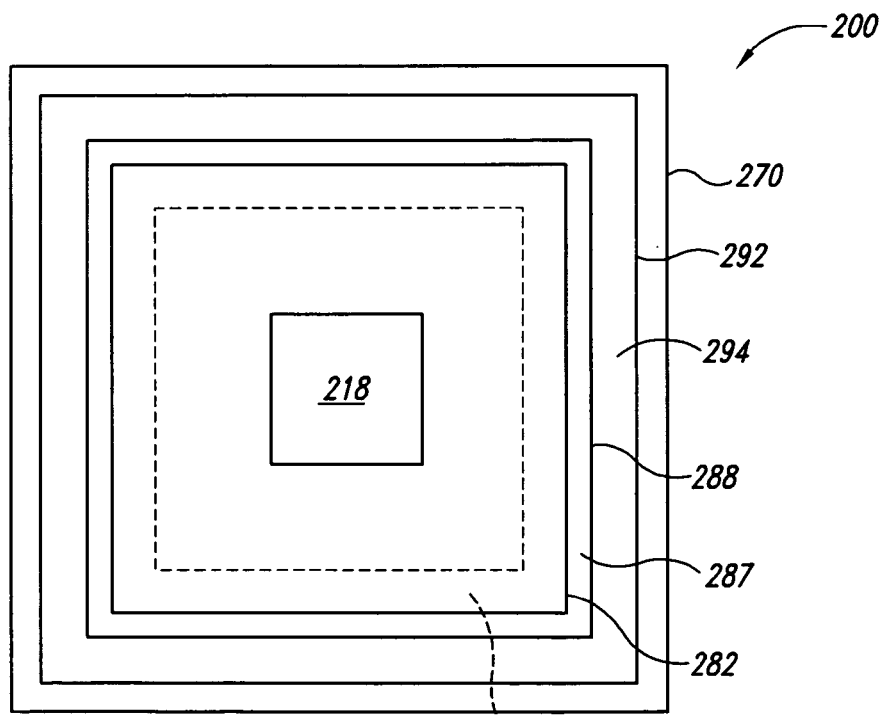
Fig. 2A
Fig. 2B

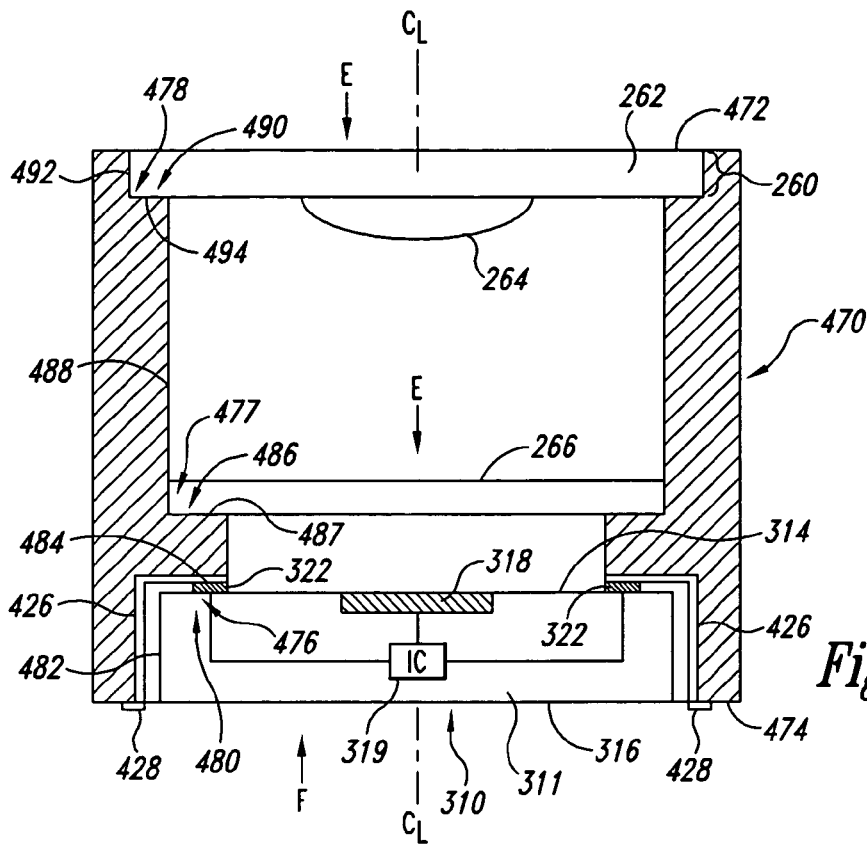
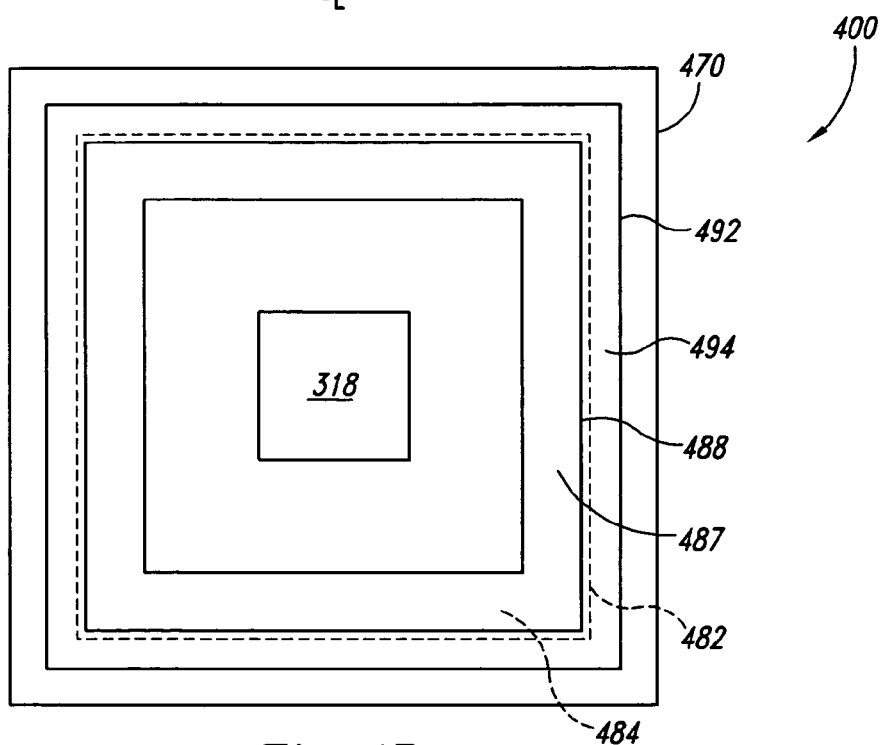

PREFABRICATED HOUSINGS FOR MICROELECTRONIC IMAGERS

TECHNICAL FIELD

The present invention is related to microelectronic devices and methods for packaging microelectronic devices. Several aspects of the present invention, more specifically, are directed toward prefabricated housings for microelectronic imagers and methods for packaging microelectronic imagers using the prefabricated housings.

BACKGROUND

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other systems. CCD image sensors have been widely used in digital cameras and other applications. CMOS image sensors are also quickly becoming very popular because they are expected to have low production costs, high yields, and small sizes. CMOS image sensors can provide these advantages because they are manufactured using technology and equipment developed for fabricating semiconductor devices. CMOS image sensors, as well as CCD image sensors, are accordingly "packaged" to protect the delicate components and to provide external electrical contacts.

FIG. 1 is a schematic view of a conventional microelectronic imager 1 with a conventional package. The imager 1 includes a die 10, an interposer substrate 20 attached to the die 10, and a housing 30 attached to the interposer substrate 20. The housing 30 surrounds the periphery of the die 10 and has an opening 32. The imager 1 also includes a transparent cover 40 over the die 10.

The die 10 includes an image sensor 12 and a plurality of bond-pads 14 electrically coupled to the image sensor 12. The interposer substrate 20 is typically a dielectric fixture having a plurality of bond-pads 22, a plurality of ball-pads 24, and traces 26 electrically coupling the bond-pads 22 to corresponding ball-pads 24. The ball-pads 24 are arranged in an array for surface mounting the imager 1 to a board or module of another device. The bond-pads 14 on the die 10 are electrically coupled to the bond-pads 22 on the interposer substrate 20 by wire-bonds 28 to provide electrical pathways between the bond-pads 14 and the ball-pads 24.

The imager 1 shown in FIG. 1 also has an optics unit including a support 50 attached to the housing 30 and a barrel 60 adjustably attached to the support 50. The support 50 can include internal threads 52, and the barrel 60 can include external threads 62 engaged with the threads 52. The optics unit also includes a lens 70 carried by the barrel 60.

One problem with packaging conventional microelectronic imagers is that it is difficult to accurately align the lens with the image sensor. Referring to FIG. 1, the centerline $C_L$ of the lens 70 should be aligned with the centerline of the image sensor 12 within very tight tolerances. For example, as microelectronic imagers have higher pixel counts and smaller sizes, the centerline of the lens 70 is often required to be within a few microns of the centerline $C_L$ of the image sensor 12. This is difficult to achieve with conventional imagers because the support 50 may not be positioned accurately on the housing 30, the barrel 60 is manually threaded onto the support 50, and the internal threads 52 and external threads 62 inherently have some spacing that may cause misalignment. Therefore, there is a need to align lenses with image sensors with greater precision in more sophisticated generations of microelectronic imagers.

Another problem of packaging conventional microelectronic imagers is that positioning the lens at a desired focus distance from the image sensor is time-consuming and may be inaccurate. The lens 70 shown in FIG. 1 is spaced apart from the image sensor 12 at a desired distance by rotating the barrel 60 (arrow R) to adjust the elevation (arrow E) of the lens 70 relative to the image sensor 12. In practice, an operator rotates the barrel 60 by hand while watching an output of the imager 1 on a display (not shown) until the picture is focused based on the operator's subjective evaluation. The operator then adheres the barrel 60 to the support 50 to secure the lens 70 in a position where it is spaced apart from the image sensor 12 by a suitable focus distance. This process is problematic because it is exceptionally time-consuming and subject to operator errors.

Yet another concern of conventional microelectronic imagers is that they have relatively large footprints and high profiles (i.e., they occupy a significant amount of horizontal and vertical space). The footprint of the imager in FIG. 1 is the surface area of the bottom of the interposer substrate 20. This is typically much larger than the surface area of the die 10 and can be a limiting factor in the design and marketability of picture cell phones or PDAs because these devices are continually shrinking to be more portable. Therefore, there is a need to provide microelectronic imagers with smaller footprints and lower profiles.

Yet another concern of conventional microelectronic imagers is the manufacturing costs for packaging the dies. The imager 1 shown in FIG. 1 is relatively expensive because manually adjusting the lens 70 relative to the image sensor 12 is very inefficient and subject to error. Moreover, the support 50 and barrel 60 are assembled separately for each die 10 individually after the dies have been singulated from a wafer and attached to the interposer substrate 20. Therefore, there is a significant need to enhance the efficiency, reliability, and precision of packaging microelectronic imagers.

BRIEF DESCRIPTION OF THE DRAWINGS

FIG. 2A is a side cross-sectional view and FIG. 2B is a top plan view of a microelectronic imager having a prefabricated housing in accordance with an embodiment of the invention.

FIG. 4A is a side cross-sectional view and FIG. 4B is a top plan view of a microelectronic imager having a prefabricated housing in accordance with yet another embodiment of the invention.

DETAILED DESCRIPTION

A. Overview

Figure 1:
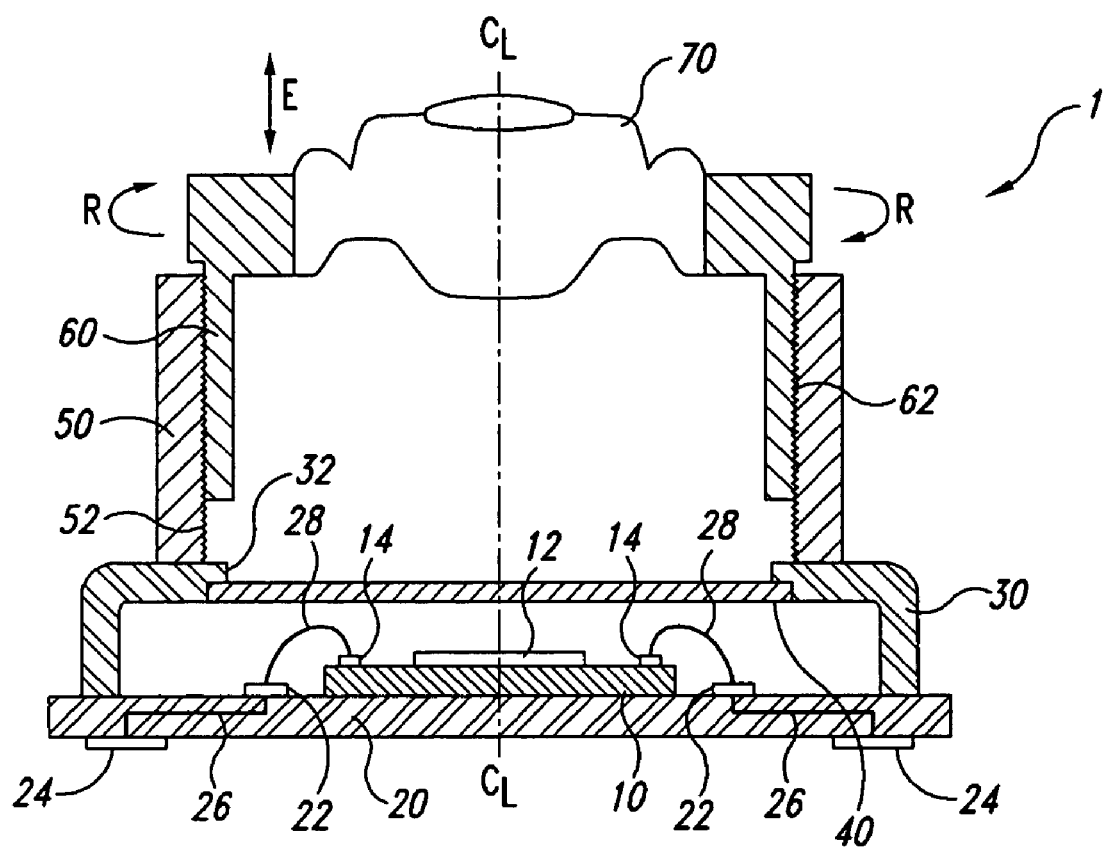
FIG. 1 is a cross-sectional view of a packaged microelectronic imager in accordance with the prior art.

The following disclosure describes several embodiments of prefabricated housings for microelectronic imagers and methods for packaging microelectronic imagers. One particular embodiment of the invention is directed toward a microelectronic imager comprising a microelectronic die having an image sensor and an integrated circuit operatively coupled to the image sensor. The imager also includes an optics unit having an optic member. The imager further includes a prefabricated housing having a first mounting site and a second mounting site. The die is seated at the first mounting site and the optics unit is seated at the second mounting site in a fixed, preset position whereby the optic member is situated at a desired location relative to the image sensor.

In several embodiments, the die includes external contacts electrically coupled to the integrated circuit. The external contacts can have several different configurations. In one embodiment, for example, the die includes terminals (e.g., bond-pads) at a front side of the die and contact pads at a backside of the die. The die further includes interconnects extending through the die electrically coupling the terminals to corresponding contact pads. In another embodiment, the prefabricated housing can include a plurality of conductive lines and a plurality of contact pads at a bottom portion of the housing. The conductive lines are positioned to contact terminals at a front side of the die and extend through the housing electrically coupling the terminals to corresponding contact pads.

The prefabricated housing can also have several different configurations. For example, in one embodiment the housing is a top-feed housing. Accordingly, the top portion of the housing has an opening that has a larger cross-sectional dimension than an opening at the bottom portion of the housing. Thus, the imager components (e.g., the die and the optics unit) are inserted through the opening in the top of the housing. In another embodiment, the opening in the bottom portion of the housing has a larger cross-sectional dimension than the top opening and the imager components are inserted through the bottom opening. In addition to these aspects regarding the imager components, the housing further includes mounting sites having interface features for positioning and aligning the various components of the imager with respect to each other. Several embodiments of microelectronic imagers in accordance with the invention, therefore, are expected to significantly reduce the time for assembling microelectronic imagers and increase the accuracy with which an optic member is positioned at a desired location relative to a corresponding image sensor.

Another aspect of the invention is directed to methods of packaging microelectronic imagers. One embodiment of such a method includes providing a microelectronic die having an image sensor, an integrated circuit operatively coupled to the image sensor, and a plurality of external contacts electrically coupled to the image sensor. The method also includes providing an optics unit having an optic member. The method further includes assembling the die and the optics unit within a prefabricated housing by seating the die with a first mounting site of the housing and seating the optics unit with a second mounting site of the housing such that the optic member is at a desired location relative to the image sensor.

Specific details of several embodiments of the invention are described below with reference to CMOS imagers to provide a thorough understanding of these embodiments, but other embodiments can be CCD imagers or other types of imagers. Several details describing well-known structures often associated with microelectronic devices are not set forth in the following description to avoid unnecessarily obscuring the description of the disclosed embodiments. Additionally, several other embodiments of the invention can have different configurations or components than those described in this section. As such, a person of ordinary skill in the art will accordingly understand that the invention may have other embodiments with additional elements or without several of the elements shown and described below with reference to FIGS. 2A-6.

B. Embodiments of Prefabricated Housings for Microelectronic Imagers

FIG. 2A is a side cross-sectional view of a microelectronic imager 200 in accordance with one embodiment of the invention. In the illustrated embodiment, the imager 200 includes an imaging die 210, an optics unit 260, and a prefabricated housing 270 to which the imaging die 210 and optics unit 260 are attached. More specifically, the housing 270 spaces the optics unit 260 apart from the die 210 by a desired distance and properly aligns the optics unit 260 with the die 210.

The die 210 can include a front side 214, a back side 216, an image sensor 218, and an integrated circuit 219 (shown schematically) operably coupled to the image sensor 218. The image sensor 218 can be a CMOS device or a CCD for capturing pictures or other images in the visible spectrum. In other embodiments, the image sensor 218 can detect radiation in other spectrums (e.g., IR or UV ranges).

The die 210 further includes a plurality of external contacts 220 for carrying signals. The external contacts 220 shown in FIG. 2A provide a small array of ball-pads within the footprint of the die 210. Each external contact 220, for example, can include a terminal 222 (e.g., a bond-pad), an external contact pad 224 (e.g., a ball-pad), and an interconnect 226 coupling the terminal 222 to the contact pad 224. In another aspect of this embodiment, a solder ball (not shown) is attached to each contact pad 224 to provide an external connection to other electronic devices on the back side 216 of the die 210. In other embodiments, the solder balls may be omitted.

In the embodiment shown in FIG. 2A, the terminals 222 are at the front side 214 of the die 210, the contact pads 224 are at the back side 216 of the die 210, and the interconnects 226 are through-wafer interconnects that extend completely through the die 210 to couple the terminals 222 to the contact pads 224. Although the terminals 222 are shown at the front side 214, they can also be at an intermediate depth within the die 210, or the die 210 may not include terminals 222. The through-wafer interconnects 226 can be formed according to the processes disclosed in U.S. patent application Ser. No. 10/713,878, entitled "Microelectronic Devices, Methods Performing Vias in Microelectronic Devices, and Methods for Packaging Microelectronic Devices," filed on Nov. 13, 2003 (Perkins Coie Docket No. 108298742US00), which is incorporated by reference herein in its entirety. In other embodiments described below, however, the die 210 may not include interconnects 226.

The optics unit 260 in the illustrated embodiment includes a substrate 262 and an optic member 264 on the substrate 262. The substrate 262 and the optic member 264 transmit at least the desired spectrum of radiation to the image sensor 218. The substrate 262 can be glass, quartz, a polymer or another suitable material, and the substrate 262 can be coated to filter selected radiation from the visible light spectrum (e.g., infrared radiation (IR)) and/or reduced reflections. The optic member 264 can be a lens for focusing the light, a pinhole for reducing higher order refractions, and/or other optical structures for performing other functions. In further embodiments, the optics unit 260 may have a different configuration and/or include other components.

The imager 200 can further include a cover 266 having a first side 267 facing generally toward the image sensor 218 and a second side 268 facing generally away from the image sensor 218. The cover 266 can be glass, quartz, or other materials transmissive to a desired spectrum of radiation. In embodiments directed toward imaging radiation in the visible spectrum, the cover 266 can also filter infrared radiation or other undesirable spectrums of radiation. The cover 266, for example, can be formed from a material and/or can have a coating that filters IR or near IR spectrums.

FIG. 2B is a top plan view of the imager 200 shown in FIG. 2A. Referring to FIGS. 2A and 2B together, the die 210, the cover 266, and the optics unit 260 are positioned relative to each other in the prefabricated housing 270. The housing 270 includes a top portion 272, a bottom portion 274, and a plurality of mounting sites 276, 277, 278. As explained in more detail below, the mounting sites 276, 277, 278 are configured to receive corresponding portions of the die 210, the cover 266, and the optics unit 260, respectively, in fixed preset positions. The housing 270 can be made of a polymer, an injection molding compound, a three-dimensional stereolithography material, or another suitable material. The housing 270 can be fabricated using an injection molding process, a three-dimensional stereolithography process, a machining process, and various combinations of these processes. In other embodiments, the housing 270 may be made of other materials and/or formed using other processes.

The first mounting site 276 in the housing 270 is a first step that includes a first interface feature 280 having a first alignment component 282 and a first stop component 284. The first alignment component 282, which can be a sidewall of the housing 270, provides a fixed surface at a known position for accurately positioning the die 210, and more particularly the image sensor 218, within the housing 270. The first stop component 284 is also at a predetermined location within the housing 270 and provides a fixed surface at a known elevation for accurately positioning the die 210 at a desired position relative to the optics unit 260 and cover 266.

The second and third mounting sites 277 and 278 in the housing 270 can be generally similar to the first mounting site 276 described above. For example, the second mounting site 277 is a second step that includes a second interface feature 286 having a second alignment component 288 and a second stop component 287. The second alignment component 288 accurately positions the cover 266 at a predetermined lateral location within the housing 270. The second stop component 287 provides a fixed surface at a known distance from the die 210 for accurately positioning the cover 266 at a desired distance with respect to the image sensor 218. The third mounting site 278 is a third step that includes a third interface feature 290 having a third alignment component 292 and a third stop component 294. The third alignment component 292 is spaced apart from the centerline $C_L$-$C_L$ of the optic member 264 by a predetermined lateral distance to align the optic member 264 with the image sensor 218 on the die 210. The third stop component 294 provides a fixed surface at a known distance from the die 210 for spacing the optic member 264 apart from the image sensor 218 by a desired focal distance.

The housing 270 in the illustrated embodiment is a top-feed housing. More specifically, the components of the imager 200 (i.e., the die 210, the cover 266, and the optics unit 260) are inserted into the housing 270 (as shown by the arrow A) through an opening in the top portion 272 of the housing 270 and positioned at different elevations within the housing 270. For example, a first opening in the housing, defined by the third alignment component 242 of the third mounting site 278, has a first cross-sectional dimension $W_1$. A second opening, defined by the second alignment component 288 of the second mounting site 277, has a second cross-sectional dimension $W_2$ less than the first cross-sectional dimension $W_1$. A third opening defined by the first alignment component 282 of the first mounting site 276, has a third cross-sectional dimension $W_3$ less than the second cross-sectional dimension $W_2$. One advantage of the top-feed feature is that the optics unit 260 can include a large optic member 264, while the microelectronic imager 200 can maintain a relatively small footprint and profile.

In some embodiments, an epoxy (not shown) is used at the mounting sites 276, 277, 278 to secure the various components of the microelectronic imager 200 to the housing 270. In other embodiments, other adhesive materials are used to secure the die 210 within the housing 270. In still further embodiments, the components of the microelectronic imager 200 are secured in the housing 270 using a snap-fit arrangement, as explained below.

Figure 2C:
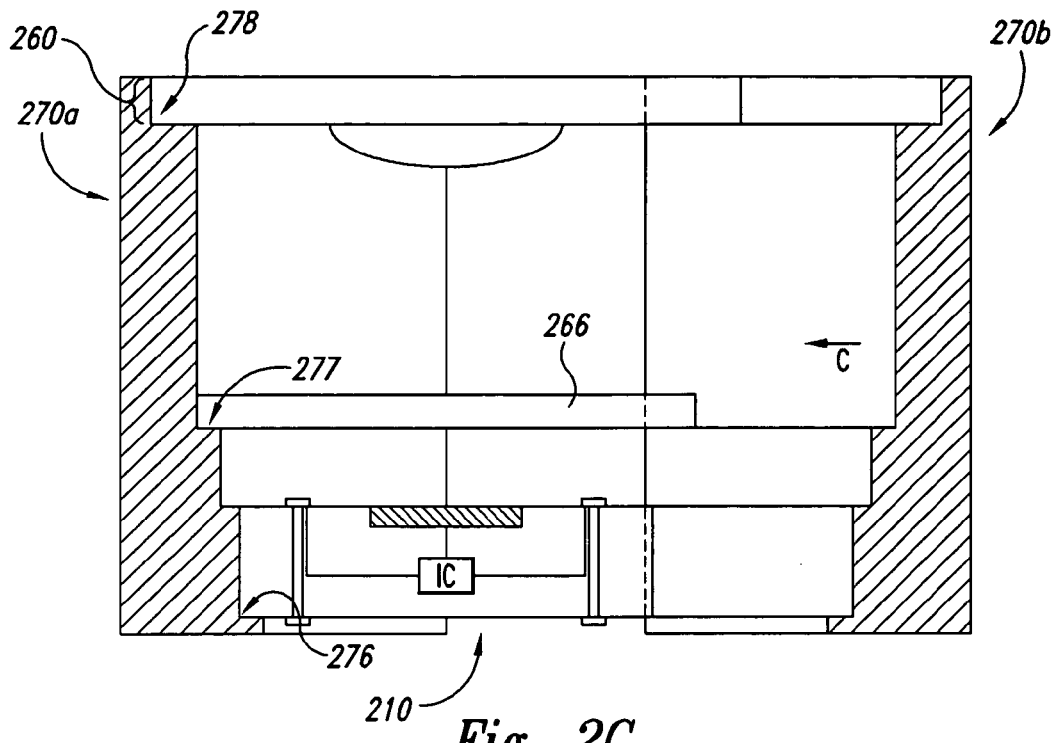
FIG. 2C is a side cross-sectional view of the microelectronic imager of FIG. 2A showing a method of assembling the imager in accordance with another embodiment of the invention.

FIG. 2C is a side cross-sectional view of the microelectronic imager 200 of FIGS. 2A and 2B illustrating another method of seating and securing the various components of the imager 200 within the housing 270. In this embodiment, the housing 270 has a first section 270a and a second section 270b. The components of the microelectronic imager 200 (i.e., the die 210, the cover 266, and the optics unit 260) are attached to the first section 270a at the corresponding mounting sites 276, 277, 278, and then the second section 270b is attached to the first section 270a (as shown by the arrow C) to securely hold the imaging die 210, the cover 266, and the optics unit 260. The first and second sections 270a and 270b can be fixed together using a snap-fit, fasteners and/or adhesives. In another embodiment (not shown), the first section has three sides and the second section defines a fourth side. The components of the microelectronic imager 200 are inserted into their respective positions in the housing 270 through the open fourth side, and then the second section is snap-fit (or glued) into place.

The prefabricated housing 270 shown in FIGS. 2A and 2B has several advantages compared to the conventional imager shown in FIG. 1 with separate housings, interposer substrates, and dies. One advantage is that the housing 270 inherently provides protection for the die 210 and the optics unit 260. This feature helps prevent contamination or possible damage to the components of the die 210 and the optics unit 260. For example, only the backside 216 of the die 210 is exposed, which is necessary to allow the contact pads 224 to contact external electrical devices.

The embodiment of the imager 200 shown in FIGS. 2A and 2B is further expected to significantly improve the accuracy with which the optic member 264 is aligned with the image sensor 218 and/or the accuracy with which the optic member 264 is spaced apart from the image sensor 218 by a desired distance. One aspect of the microelectronic imager 200 is that the mounting sites of the housing 270 can be fabricated using semiconductor processing technologies. Accordingly, the locations of the mounting sites within the housing 270 can be controlled to within very tight tolerances using three-dimensional stereolithography processes and/or other fabrication processes. This enables the mounting sites to be positioned and configured with very precise dimensions compared to manually installing the components in conventional imagers as shown in FIG. 1.

Several embodiments of the microelectronic imager 200 are also expected to improve the efficiency of packaging imagers compared to the conventional imager shown in FIG. 1. The housing 270 eliminates a number of components and steps in the assembly of the microelectronic imager 200 as compared with conventional imagers. For example, the die 210 and the optics unit 260 can be seated at corresponding portions of the housing 270 using automated equipment because the mounting sites 276, 277, 278 inherently position the optic member 264 at the desired position relative to the image sensor 218. The imager 200 accordingly eliminates manually positioning individual lenses with respect to image sensors, as described above with respect to the conventional imager of FIG. 1. Therefore, the structure of the imager 200 enables processes that significantly enhance the throughput and yield of packaging microelectronic imagers.

Another feature of the microelectronic imager 200 illustrated in FIGS. 2A and 2B is that the imager 200 can be much smaller than the conventional imager shown in FIG. 1. The footprint of the microelectronic imager 200 can be nearly as small as the size of the die 210 because the die 210 is not mounted to a separate interposer substrate. This is possible because the interconnects 226 provide an electrical connection to an array of ball-pads 224 on the backside 216 of the die 210 instead of using wire-bonds on the front side 214 of the die 210. The height of the microelectronic imager 200 is also less than with conventional imagers because the imager 200 can be mounted directly to a module or board without an interposer substrate. Therefore, the microelectronic imager 200 is expected to have a smaller footprint and a lower profile than conventional microelectronic imagers, which is particularly advantageous for picture cell phones, PDAs, and other applications where space is limited.

Figure 3A:
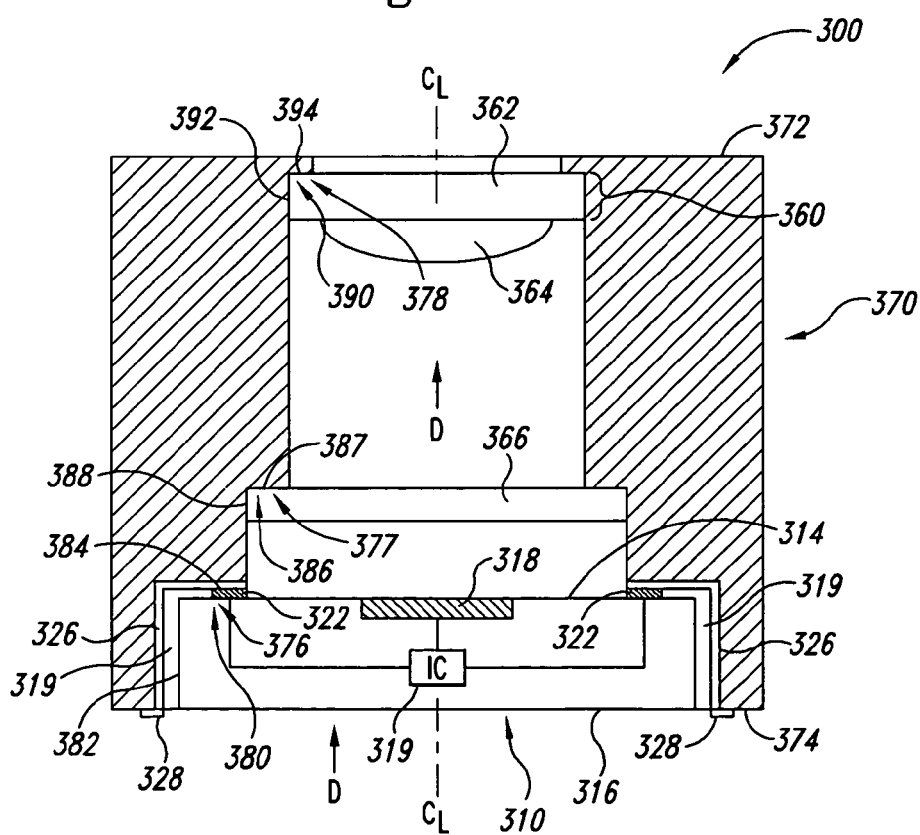
FIG. 3A is a side cross-sectional view.
Figure 3B:
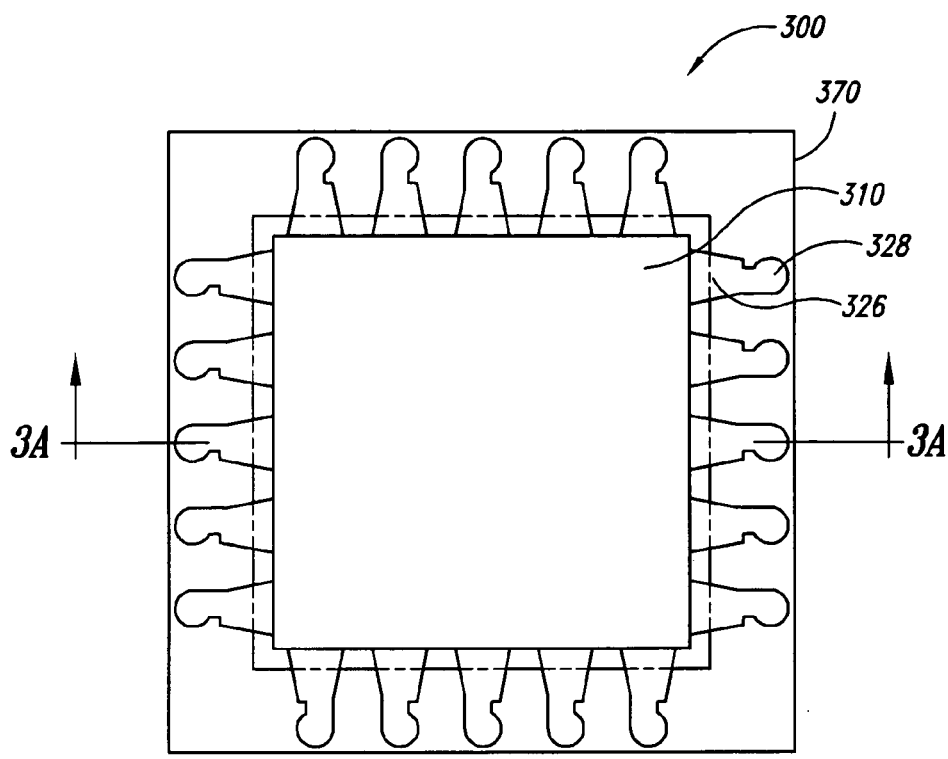
FIG. 3B is a bottom plan view.
Figure 3C:
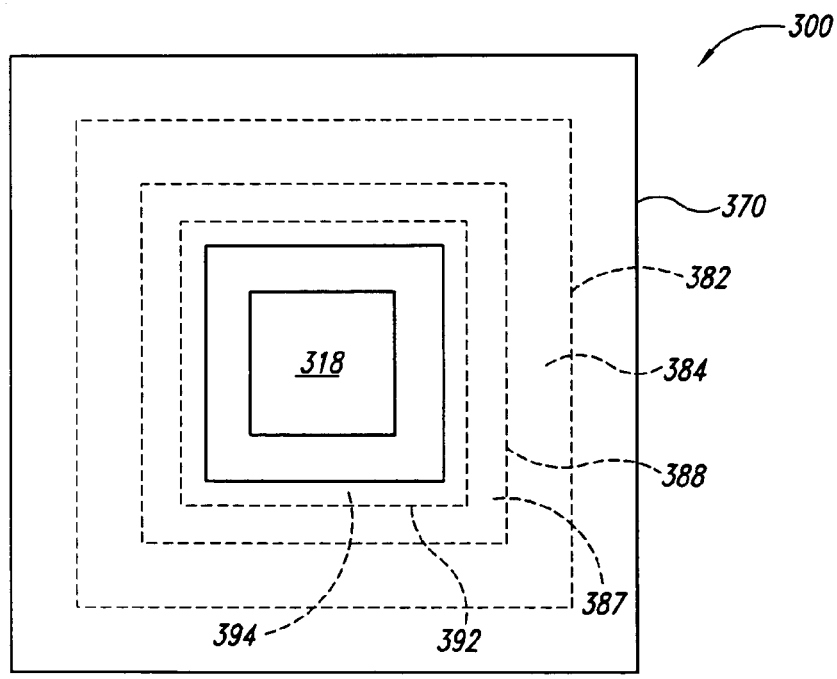
FIG. 3C is a top plan view of a microelectronic imager having a prefabricated housing in accordance with another embodiment of the invention.

FIG. 3A is a side cross-sectional view, FIG. 3B is a bottom plan view, and FIG. 3C is a top plan view of a microelectronic imager 300 in accordance with another embodiment of the invention. The microelectronic imager 300 can include generally the same components as the microelectronic imager 200 described above with respect to FIGS. 2A and 2B (e.g., a die, a cover, and an optics unit). In this embodiment, the components of the microelectronic imager 300 are positioned in a prefabricated housing 370 that includes a top portion 372, a bottom portion 374, and a plurality of mounting sites 376, 377, 378. The primary difference between the housing 370 shown in FIG. 3A and the housing 270 shown in FIG. 2A is that the housing 370 is a bottom-feed housing. Accordingly, the components of the microelectronic imager 300 in this embodiment are inserted into the imager 300 through an opening in the bottom portion 374 of the housing 370, as shown by the arrow D. One advantage of this feature is that the microelectronic imager 300 can include a large die 310, while maintaining a relatively small footprint and profile.

The die 310 includes a front side 314, a backside 316, an image sensor 318, and an integrated circuit 319 (shown schematically) operably coupled to the image sensor 318. The die 310 further includes a plurality of external contacts 322 (e.g., terminals) electrically coupled to the integrated circuit 319. The die 310 differs from the die 210 shown in FIG. 2A in that the die 310 does not have through-wafer interconnects extending from the terminals 322 to the backside 316 of the die 310. Instead, the housing 370 includes a plurality of conductive lines 326 extending through the housing 370.

Referring to FIGS. 3A and 3B together, the conductive lines 326 are positioned to electrically couple the terminals 322 at the front side 314 of the die 310 to corresponding contact pads 328. The die 310 is positioned within the housing 270 such that the terminals 322 contact at least a portion of the corresponding conductive lines 326. In the illustrated embodiment, the conductive lines 326 are metal runners preformed in the housing 270. In other embodiments, the conductive lines 326 may have other configurations and/or be formed from other materials. The conductive lines 326 extend to the bottom 374 of the housing 370 and are electrically coupled to corresponding contact pads 328. A portion of the housing 370 between the die 310 and the conductive lines 326 can be filled in with a sealant 319.

Referring to FIG. 3A again, the microelectronic imager 300 also includes an optics unit 360 and cover 366 generally similar to the optics unit 260 and cover 266 described above with respect to FIG. 2A. The optics unit 360 includes a substrate 362 and an optic member 364. The substrate 362 and optic member 364 can be made of similar materials and operate in substantially the same way as the substrate 262 and optic member 264 described above with respect to FIG. 2A. The cover 366 can be made of glass, quartz, or other materials transmissive to a desired spectrum of radiation. In other embodiments directed toward imaging radiation in the visible spectrum, the cover 366 can also filter IR or other undesirable spectrums of radiation.

Referring to FIGS. 3A and 3C together, the die 310, the cover 366, and the optics unit 360 are inserted into the prefabricated housing 370 through the bottom 374 of the housing 370 and seated at the mounting sites 376, 377, 378, respectively, in fixed preset positions. The mounting sites 376, 377, 378 can be generally similar to the mounting sites 276, 277, 278 described above with respect to FIGS. 2A and 2B. For example, the mounting sites 376, 377, 378 include interface features 380, 386, 390, respectively. The interface features 380, 386, 390 include alignment components 382, 388, 392 and stop components 384, 387, 394, respectively. The mounting sites illustrated in FIGS. 3A and 3C differ from those shown in FIGS. 2A and 2B in that the mounting sites 376, 377, 378 are oriented generally downward, as opposed to the generally upward orientation of the mounting sites 276, 277, 278 in FIGS. 2A and 2B.

As explained above with respect to the imager 200, the alignment components 382, 388, 392 laterally align the components of the imager 300 within the housing 370 relative to the centerline $C_L$. For example, the first alignment component 382, which can be a sidewall of the housing 370, provides a fixed surface at a known position for accurately positioning the die 310, and more particularly the image sensor 318 and the terminals 322, within the housing 370. The stop components 384, 387, 394 space the components of the imager 300 apart from each other by a desired distance. The imager 300, therefore, is expected to have many of the same advantages as the imager 200.

In some embodiments, an epoxy (not shown) is used at the mounting sites to secure the various components of the microelectronic imager 300 within the housing 370. In other embodiments, other adhesive materials are used to secure the various components within the housing 370 or, alternatively, the components of the microelectronic imager 300 can be secured within the housing 370 using a snap-fit arrangement.

C. Additional Embodiments of Prefabricated Housings for Microelectronic Imagers

FIG. 4A is a side cross-sectional view and FIG. 4B is a top plan view of a microelectronic imager 400 in accordance with another embodiment of the invention. In this embodiment, the imager 400 has several components that are similar to the imagers 200 and 300; like reference numbers accordingly refer to like components in FIGS. 2A-3B and FIGS. 4A-4B. The imager 400 can include the die 310, the cover 266, and the optics unit 260 seated in a prefabricated housing 470. The primary difference between the housing 470 shown in FIG. 4A and the housings shown in FIGS. 2A and 3A is that the housing 470 is both a top-feed and a bottom-feed housing. More specifically, the cover 266 and optics unit 260 are inserted through an opening in the top 472 of the housing 470 (as indicated by the arrow E), and the die 310 is inserted through an opening in the bottom 474 of the housing 470 (as indicated by the arrow F).

The housing 470 includes mounting sites 476, 477, 478, which are configured to receive corresponding portions of the die 310, the cover 266, and the optics unit 260, respectively, in fixed preset positions. The first mounting site 476 includes a first interface feature 480 having a first alignment component 482 and a first stop component 484. The first alignment component 482, which can be a sidewall of the housing 470, provides a fixed surface at a known position for accurately positioning the die 310, and more particularly the image sensor 318 and the terminals 322, within the housing 470. The first stop component 484 is also at a predetermined location within the housing 470 and provides a fixed surface at a known location for accurately positioning the die 310, and accordingly the image sensor 318 and terminals 322, at a desired position relative to the other components of the microelectronic imager 400.

The second and third mounting sites 477 and 478 can be generally similar to the first mounting site 476 described above. For example, the second mounting site 477 includes a second interface feature 486 having a second alignment component 488 and a second stop component 487. The second alignment component 488 accurately positions the cover 266 at a predetermined lateral location within the housing 470. The second stop component 487 provides a fixed surface at a known distance from the die 310 for accurately positioning the cover 266 at a desired focus distance with respect to the image sensor 318. The third mounting site 478 includes a third interface feature 490 having a third alignment component 492 and a third stop component 494. The third alignment component 492 is spaced apart from the centerline $C_L$-$C_L$ of the optic member 264 by a predetermined lateral distance to align the optic member 264 with the image sensor 318. The third stop component 494 provides a fixed surface at a known distance from the die 310 for positioning the optic member 264 at a desired focus distance from the image sensor 318. In some embodiments, an epoxy (not shown) is used at the mounting sites 476, 477, 478 to secure the various components of the microelectronic imager 400 within the housing 270. In other embodiments, other adhesive materials are used to secure the various components within the housing 470 or, alternatively, the components of the microelectronic imager 400 are secured within the housing 470 using a snap-fit arrangement.

Figure 5:
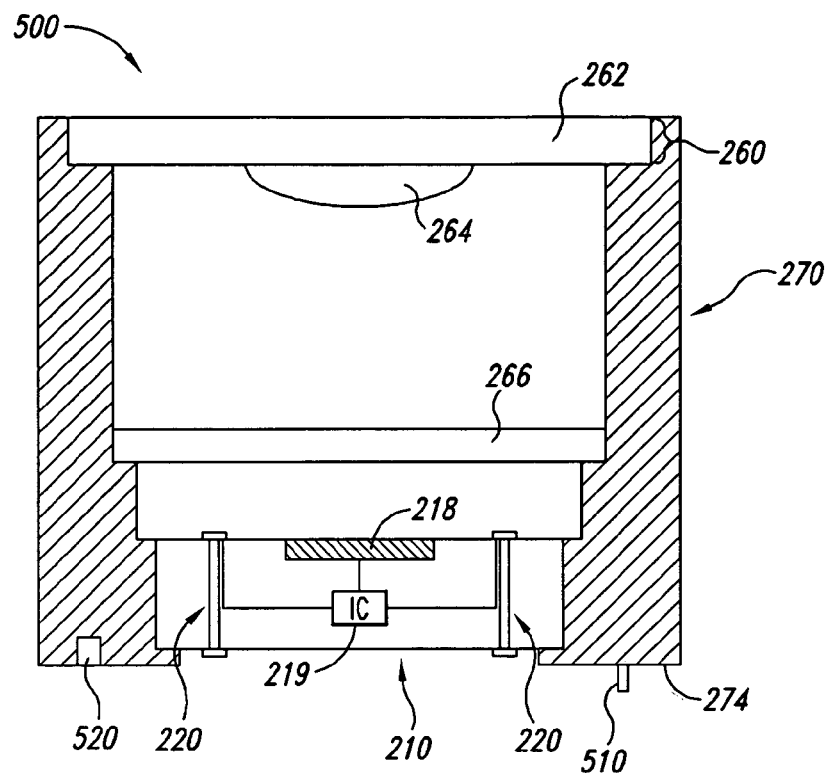
FIG. 5 is a side cross-sectional view of a microelectronic imager having a prefabricated housing with alignment features in accordance with an embodiment of the invention.

FIG. 5 is a side cross-sectional view of a microelectronic imager 500 in accordance with another embodiment of the invention. In this embodiment, the microelectronic imager 500 can be similar to the microelectronic imager 200; like reference numbers accordingly refer to like components in FIG. 2A and FIG. 5. The primary difference between the imager 500 shown in FIG. 5 and the imager 200 shown in FIG. 2A is that the imager 500 includes alignment features to mount the imager 500 to a board or module of another device. More specifically, the imager 500 includes a first alignment feature 510 and a second alignment feature 520 at the bottom 274 of the housing 270. The first alignment feature 510 in this embodiment is a pin operably coupled to the housing 270 and configured to engage and mate with a corresponding feature (not shown) on a board or module of another device. In other embodiments, the pin 510 can be an integral component of the housing 270. The second alignment feature 520 in the illustrated embodiment is an aperture that is also configured to engage and mate with a corresponding feature (not shown) on a board or module of another device. In other embodiments, the first and second alignment features 510 and 520 can both have the same configuration (e.g., the alignment features are both pins) and/or the imager 500 may include additional alignment features. One advantage of the alignment features 510 and 520 is that they significantly enhance the efficiency and throughput of aligning and attaching the microelectronic imager 500 to an external board and/or device. Furthermore, the alignment features 510 and 520 also help align external contact pads with corresponding contacts on the external board or module.

Figure 6:
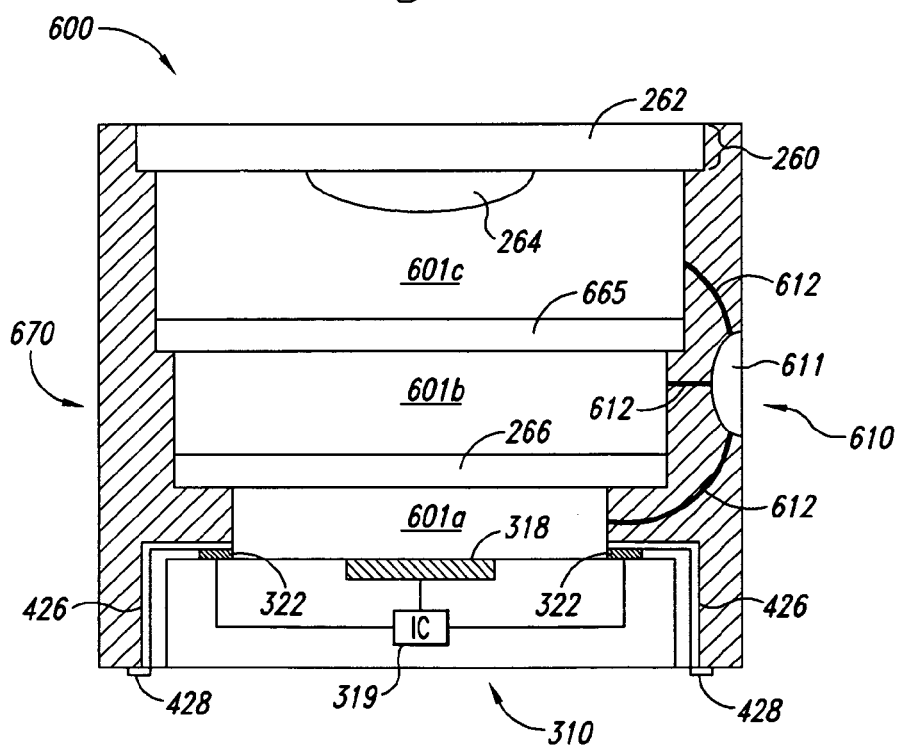
FIG. 6 is a side cross-sectional view of a microelectronic imager having a prefabricated housing with a vent system in accordance with an embodiment of the invention.

FIG. 6 is a side cross-sectional view of a microelectronic imager 600 in accordance with another embodiment of the invention. In this embodiment, the imager 600 has several components that are similar to the imager 400; like reference numbers accordingly refer to like components in FIGS. 4A and 6. The imager 600 can include the die 310, the cover 266, and the optics unit 260 seated at preset positions within a prefabricated housing 670. In the illustrated embodiment, the optics unit 260 further includes a focus lens 665 seated in the housing 670 and at a desired location with respect to the image sensor 318.

In another aspect of this embodiment, the imager 600 includes a vent 610 positioned to compensate for changes in atmospheric pressure and/or temperature due to the varying operating conditions of the imager 600. In the embodiment shown in FIG. 6, the vent 610 includes a bladder 611 and a plurality of vent lines 612. The bladder 611 can be an aluminized Mylar® film membrane that expands and contracts depending on the pressure within the compartment in the imager 600. In other embodiments, the bladder 611 may be formed of other materials. The vent lines 612 are operably coupled to the bladder 611 and extend through the housing 670 to sealed chambers 601a-601c within the imager 600. The vent lines 612 allow the pressure within the chambers 601a-601c of the imager 600 to reach equilibrium with the ambient pressure outside the imager 600.

One advantage of this feature is that the vent 610 allows the imager 600 to function properly in a variety of operating conditions without causing undue stress on the imager 600 or its components. For example, if the imager 600 is used in an environment with a high temperature and/or low ambient pressure, the pressure in the chambers 601a-601c will be much higher than the ambient pressure. This in turn will exert stress on the various components in the imager 600. Without the vent 610, the components of the imager 600 may flex and twist causing the imager 600 to be damaged and/or malfunction. However, the vent 610 normalizes the pressure within the chambers 601a-601c to reduce the risk of damage to the imager 600.

From the foregoing, it will be appreciated that specific embodiments of the invention have been described herein for purposes of illustration, but that various modifications may be made without deviating from the spirit and scope of the invention. For example, microelectronic imagers with prefabricated housings can have any combination of the features described above with reference to FIGS. 2A-6. Accordingly, the invention is not limited except as by the appended claims.

We claim:

1. A microelectronic imager, comprising:
    a microelectronic die including an image sensor and an integrated circuit operatively coupled to the image sensor;
    an optics unit having an optic member; and
    a prefabricated housing having a first mounting site and a second mounting site fixed relative to the first mounting site, the die being seated at the first mounting site and the optics unit being seated at the second mounting site in a fixed, preset position at a desired location relative to the image sensor, wherein the second mounting site is located at a top portion of the prefabricated housing;
    wherein the prefabricated housing further comprises a vent positioned to allow expansion of the imager during periods when the imager is subjected to increased heat and/or pressure.

2. The imager of claim 1 wherein:
    the first mounting site includes a first interface feature having a first alignment component and a first stop component, the first alignment component being a preset lateral location from the image sensor and the first stop component being at a fixed preset elevation from the image sensor;
    the second mounting site includes a second interface feature having a second alignment component and a second stop component, the second alignment component being a preset lateral location from the image sensor and the second stop component being at a fixed preset elevation from the image sensor; and
    the die is engaged with the first interface feature and the optics unit is engaged with the second interface feature such that the optic member is aligned with a centerline of the image sensor and spaced apart from the image sensor by a desired distance.

3. The imager of claim 1 wherein:
    the die includes a front side, a backside, and external contacts electrically coupled to the integrated circuit, the external contacts including a plurality of terminals at the front side of the die and electrically coupled to the integrated circuit; and
    the prefabricated housing further comprises a plurality of conductive lines and a plurality of contact pads at a bottom portion of the housing, the conductive lines being positioned to contact corresponding terminals and extend through the housing electrically coupling the terminals to corresponding contact pads.

4. The imager of claim 1 wherein the die includes a front side, a backside, and external contacts electrically coupled to the integrated circuit, the external contacts including a plurality of terminals at the front side of the die, a plurality of contact pads at the backside of the die, and interconnects extending through the die electrically coupling the terminals to corresponding contact pads.

5. The imager of claim 1 wherein:
    the prefabricated housing includes a top portion having a first opening with a first cross-sectional dimension and a bottom portion having a second opening with a second cross-sectional dimension, wherein the first cross-sectional dimension is larger than the second cross-sectional dimension;
    the die has a lateral width greater than the second cross-sectional dimension, but less than the first cross-sectional dimension; and
    the optics unit has a lateral width greater than the second cross-sectional dimension, but less than the first cross-sectional dimension.

6. The imager of claim 1 wherein:
    the prefabricated housing includes a top portion having a first opening with a first cross-sectional dimension and a bottom portion having a second opening with a second cross-sectional dimension, wherein the second cross-sectional dimension is larger than the first cross-sectional dimension;
    the die has a lateral width greater than the first cross-sectional dimension, but less than the second cross-sectional dimension; and
    the optics unit has a lateral width greater than the first cross-sectional dimension, but less than the second cross-sectional dimension.

7. The imager of claim 1 wherein:
    the imager further comprises a cover over the die; and
    the prefabricated housing further comprises a third mounting site, and wherein the cover is seated at the third mounting site to position the cover at a desired location with respect to the image sensor.

8. The imager of claim 1 wherein the prefabricated housing further comprises sidewalls defining a compartment enclosing the image sensor.

9. The imager of claim 1 wherein:
    the imager further comprises a plurality of sealed chambers defined by the housing, the die, and the optics unit; and
    the vent further comprises a bladder and a plurality of vent lines operably coupling the bladder to corresponding sealed chambers; and
    the vent is positioned to allow expansion of the imager during periods when the imager is subjected to increased heat and/or pressure.

10. The imager of claim 1 wherein the prefabricated housing comprises a polymer, an injection molding compound, and/or a three-dimensional stereolithography material.

11. The imager of claim 1 wherein the prefabricated housing further comprises an alignment feature, the alignment feature being positioned to mate with a complementary alignment feature when attaching the imager to an external device.

12. A microelectronic imager, comprising:
    a microelectronic die including an image sensor and an integrated circuit operatively coupled to the image sensor;
    an optics unit having an optic member; and
    a prefabricated housing having a first step and a second step, the first step having a first alignment component, the second step having a second alignment component at a lateral distance from the image sensor along an axis normal to the image sensor by a separation distance, wherein the die is attached to the first step and the optics unit is attached to the second step to space the optic member apart from the image sensor by a desired distance, and wherein the prefabricated housing further comprises an alignment feature, the alignment feature being positioned to mate with a complementary alignment feature when attaching the imager to an external device.

13. The imager of claim 12 wherein the die includes a front side, a backside, and external contacts electrically coupled to the integrated circuit, the external contacts including a plurality of terminals at the front side of the die, a plurality of contact pads at the backside of the die, and interconnects extending through the die electrically coupling the terminals to corresponding contact pads.

14. The imager of claim 12 wherein:
the die includes a front side, a backside, and external contacts electrically coupled to the integrated circuit, the external contacts including a plurality of terminals at the front side of the die and electrically coupled to the integrated circuit; and
the prefabricated housing further comprises a plurality of conductive lines and a plurality of contact pads at a bottom portion of the housing, the conductive lines being positioned to contact corresponding terminals and extend through the housing electrically coupling the terminals to corresponding contact pads.

15. The imager of claim 12 wherein:
the prefabricated housing includes a top portion having a first opening with a first cross-sectional dimension and a bottom portion having a second opening with a second cross-sectional dimension, wherein the second cross-sectional dimension is larger than the first cross-sectional dimension;
the die has a lateral width greater than the first cross-sectional dimension, but less than the second cross-sectional dimension; and
the optics unit has a lateral width greater than the first cross-sectional dimension, but less than the second cross-sectional dimension.

16. The imager of claim 12 wherein:
the imager further comprises a cover over the die; and
the prefabricated housing further comprises a third step, and wherein the cover is seated at the third step to position the cover at a desired location with respect to the image sensor.

17. The imager of claim 12 wherein:
the imager further comprises a plurality of sealed chambers defined by the housing, the die, and the optics unit;
the prefabricated housing further comprises a vent having a bladder and a plurality of vent lines, the vent lines operably coupling the bladder to corresponding sealed chambers, and
wherein the vent is positioned to allow expansion of the imager during periods when the imager is subjected to increased heat and/or pressure.

18. The imager of claim 12 wherein the first step defines a first mounting site and the second step defines a second mounting site.

19. The imager of claim 12 wherein the prefabricated housing comprises a polymer, an injection molding compound, and/or a three-dimensional stereolithography material.

20. A microelectronic imager, comprising:
a microelectronic die including an image sensor, an integrated circuit operatively coupled to the image sensor, and external contacts electrically coupled to the integrated circuit;
a cover over the die;
an optics unit having an optic member; and
a prefabricated housing having a first mounting site, a second mounting site, and a third mounting site, wherein the first, second, and third mounting sites each have an alignment component and a stop component, and wherein the die is seated with the first mounting site, the cover is seated with the second mounting site, and the optics unit is seated with the third mounting site to space the optic member apart from the image sensor by a desired distance.

21. The imager of claim 20 wherein:
the die includes a front side and a backside; and
the external contacts include a plurality of terminals at the front side of the die, a plurality of contact pads at the backside of the die, and interconnects extending through the die electrically coupling the terminals to corresponding contact pads.

22. The imager of claim 20 wherein:
the die includes a front side and a backside;
the external contacts include a plurality of terminals at the front side of the die and electrically coupled to the integrated circuit; and
the prefabricated housing further comprises a plurality of conductive lines and a plurality of contact pads at a bottom portion of the housing, the conductive lines being positioned to contact corresponding terminals and extend through the housing electrically coupling the terminals to corresponding contact pads.

23. The imager of claim 20 wherein:
the third mounting site includes an interface feature having an alignment component and a stop component, the alignment component being a preset lateral location from a centerline of the image sensor and the stop component being at a fixed preset elevation from the image sensor; and
the optics unit is engaged with the interface feature whereby the optic member is aligned with the centerline of the image sensor and spaced apart from the image sensor by a desired distance.

24. The imager of claim 20 wherein the prefabricated housing further comprises a vent positioned to allow expansion of the imager during periods when the imager is subjected to increased heat and/or pressure.

25. The imager of claim 20 wherein: the imager further comprises a plurality of sealed chambers defined by the housing, the die, the cover, and the optics unit; and
the prefabricated housing further comprises a vent having a bladder and a plurality of vent lines operably coupling the bladder to corresponding sealed chambers, and wherein the vent is positioned to allow expansion of the imager during periods when the imager is subjected to increased heat and/or pressure.

26. The imager of claim 20 wherein the prefabricated housing comprises a polymer, an injection molding compound, and/or a three-dimensional stereolithography material.

27. A microelectronic imager, comprising:
a microelectronic die including an image sensor, an integrated circuit operatively coupled to the image sensor, and terminals electrically coupled to the integrated circuit;
an optics unit having an optic member; and
a prefabricated housing including (a) a first mounting site and a second mounting site, and (b) a plurality of conductive lines and a plurality of contact pads at an external area of the housing, wherein the die is seated at the first mounting site and the optics unit is seated at the second mounting site in a fixed, preset position in which the optic member is situated at a desired location relative to the image sensor, and wherein the conductive lines contact corresponding terminals and extend along the housing to corresponding contact pads, and wherein the prefabricated housing further comprises a vent positioned to allow expansion of the imager during periods when the imager is subjected to increased heat and/or pressure.

28. The imager of claim 27 wherein:

the housing includes a top portion having a first opening with a first dimension and a bottom portion having a second opening with a second dimension, wherein the second dimension is larger than the first dimension;

the die has a lateral width greater than the first dimension, but less than the second dimension; and the optics unit has a lateral width greater than the first dimension, but less than the second dimension.

29. The imager of claim 27 wherein:

the imager further comprises a cover over the die; and the housing further comprises a third mounting site, and wherein the cover is seated at the third mounting site to position the cover at a desired location with respect to the image sensor.

30. The imager of claim 27 wherein:

the imager further comprises a plurality of sealed chambers defined by the housing, the die, and the optics unit;

the vent further comprises a bladder and a plurality of vent lines operably coupling the bladder to corresponding sealed chambers, and the vent is positioned to allow expansion of the imager during periods when the imager is subjected to increased heat and/or pressure.

31. The imager of claim 27 wherein the prefabricated housing comprises a polymer, an injection molding compound, and/or a three-dimensional stereolithography material.

32. The imager of claim 27 wherein the prefabricated housing further comprises an alignment feature, the alignment feature being positioned to mate with a complementary alignment feature when attaching the imager to an external device.

* * * * *